(12) United States Patent
Asano (10) Patent No.: US 11,435,408 B2
(45) Date of Patent: Sep. 6, 2022

(54) EXTERNAL POWER FEED SYSTEM AND ELECTRIC LEAK DETECTION METHOD THEREFOR

(71) Applicant: TOYOTA JIDOSHA KABUSHIKI KAISHA, Toyota (JP)

(72) Inventor: Masahiro Asano, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 150 days.

(21) Appl. No.: 16/154,854

(22) Filed: Oct. 9, 2018

(65) Prior Publication Data
US 2019/0181630 A1    Jun. 13, 2019

(30) Foreign Application Priority Data

Dec. 8, 2017  (JP) .............................. JP2017-235642

(51) Int. Cl.
*G01R 31/52*  (2020.01)
*H02H 3/16*   (2006.01)
*H02H 1/00*   (2006.01)

(52) U.S. Cl.
CPC ........... *G01R 31/52* (2020.01); *H02H 1/0007* (2013.01); *H02H 3/16* (2013.01)

(58) Field of Classification Search
CPC ...... H03H 3/16; G01R 31/3008; G01R 31/50; G01R 31/52; Y04S 10/126; Y02T 10/62; Y02T 10/72; B60L 3/0069
See application file for complete search history.

(56) References Cited

U.S. PATENT DOCUMENTS

| | | | | |
|---|---|---|---|---|
| 8,875,487 B2 * | 11/2014 | Katsuta | ................. | F01N 3/2013 60/284 |
| 2007/0247770 A1 * | 10/2007 | Ishikawa | ................... | B60L 3/04 361/42 |
| 2011/0121780 A1 | 5/2011 | Fukuo et al. | | |
| 2013/0200699 A1 * | 8/2013 | Origane | ..................... | H02J 1/04 307/10.6 |
| 2014/0002011 A1 * | 1/2014 | Ang | ....................... | H01R 31/06 320/107 |
| 2014/0103883 A1 * | 4/2014 | Mitsutani | ................ | B60L 58/12 320/162 |

(Continued)

FOREIGN PATENT DOCUMENTS

| | | |
|---|---|---|
| CN | 102074979 A | 5/2011 |
| JP | 2009261133 A | 11/2009 |

(Continued)

*Primary Examiner* — Alex Torres-Rivera
(74) *Attorney, Agent, or Firm* — Dickinson Wright, PLLC (57) ABSTRACT

An external power feed system includes a vehicle and an external power feed device disposed outside the vehicle. The external power feed device includes an external electric leak detector configured to detect an electric leak. The vehicle includes a power supply device configured to supply electric power to the external power feed device. The vehicle includes an external power feed relay. The external power feed relay is disposed between the external power feed device and the power supply device when the external power feed device is connected to the vehicle. The vehicle includes a controller configured to control the external power feed relay such that the external power feed relay is turned off when the external electric leak detector detects an electric leak.

6 Claims, 6 Drawing Sheets

(56) References Cited

U.S. PATENT DOCUMENTS

| | | | |
|---|---|---|---|
| 2014/0368211 A1* | 12/2014 | Inoue | B60L 3/0069 |
| | | | 324/509 |
| 2015/0191164 A1* | 7/2015 | Kinomura | B60L 50/51 |
| | | | 701/22 |
| 2015/0241500 A1* | 8/2015 | Mochizuki | B60L 3/04 |
| | | | 324/418 |
| 2016/0052411 A1 | 2/2016 | Tanabe | |
| 2016/0137065 A1 | 5/2016 | Matsubara et al. | |
| 2016/0229444 A1* | 8/2016 | Toda | B62D 5/046 |
| 2018/0029498 A1* | 2/2018 | Taruya | B60L 1/00 |

FOREIGN PATENT DOCUMENTS

| | | | |
|---|---|---|---|
| JP | 2013079903 A | 5/2013 |
| JP | 2014036467 A | 2/2014 |
| JP | 2014195340 A | 10/2014 |
| JP | 2016096642 A | 5/2016 |

* cited by examiner

EXTERNAL POWER FEED SYSTEM AND ELECTRIC LEAK DETECTION METHOD THEREFOR

INCORPORATION BY REFERENCE

The disclosure of Japanese Patent Application No. 2017-235642 filed on Dec. 8, 2017 including the specification, drawings and abstract is incorporated herein by reference in its entirety.

BACKGROUND

1. Technical Field

The present disclosure relates to an external power feed system and an electric leak detection method therefor.

2. Description of Related Art

An external power feed system that supplies electric power from a fuel cell and a secondary battery mounted in a fuel cell vehicle to an external load is known (for example, Japanese Unexamined Patent Application Publication No. 2016-096642 (JP 2016-096642 A)). A method that detects an electric leak in a power supply path using an electric leak detector connected to a secondary battery in a vehicle is disclosed (for example, Japanese Unexamined Patent Application Publication No. 2014-036467 (JP 2014-036467)).

SUMMARY

However, how to detect an electric leak or to specify an electric leak part in a case where the above-described external power feed system is used has not been sufficiently examined.

The present disclosure provides an external power feed system and an electric leak detection method therefor.

A first aspect of the present disclosure relates to an external power feed system. The external power feed system includes a vehicle and an external power feed device disposed outside the vehicle. The external power feed device includes an external electric leak detector configured to detect an electric leak. The vehicle includes a power supply device configured to supply electric power to the external power feed device. The vehicle includes an external power feed relay. The external power feed relay is disposed between the external power feed device and the power supply device when the external power feed device is connected to the vehicle. The vehicle includes a controller configured to control the external power feed relay such that the external power feed relay is turned off when the external electric leak detector detects the electric leak. According to the first aspect of the present disclosure, it is possible to correctly detect the occurrence of an electric leak in the external power feed system with the external electric leak detector connected to the external power feed device. Then, the external power feed relay is turned off, whereby it is possible to stop power feed to the external power feed device, and as a result, it is possible to restrain an electric leak when an electric leak occurs in the external power feed device.

In the external power feed system according to the first aspect of the present disclosure, the power supply device may include an internal electric leak detector configured to detect an electric leak. The controller may be configured to control the internal electric leak detector such that, in a case where the external power feed relay is controlled such that the external power feed relay is turned on, detection of an electric leak of the internal electric leak detector is invalidated, and in a case where the external power feed relay is turned off, detection of an electric leak of the internal electric leak detector is validated. According to the first aspect of the present disclosure, in a case where the external power feed relay is controlled such that the external power feed relay is turned on, it is possible to suppress erroneous detection of an electric leak of the internal electric leak detector due to the influence of the external power feed device.

In the external power feed system according to the first aspect of the present disclosure, the controller may be configured to, in a case where the internal electric leak detector detects an electric leak after the external power feed relay is controlled to be turned off, determine that an electric leak occurs in the power supply device. The controller may be configured to, in a case where the internal electric leak detector detects no electric leak after the external power feed relay is controlled to be turned off, determine that an electric leak occurs in the external power feed device. According to the first aspect of the present disclosure, in a case where an electric leak is detected with the external electric leak detector of the external power feed device, the external power feed relay is controlled to be turned off to separate the external power feed device, and determination can be made whether or not there is an electric leak on the vehicle side with the internal electric leak detector on the vehicle side, and when there is no electric leak on the vehicle side, determination can be made that there is an electric leak in the external power feed device.

The external power feed system according to the first aspect of the present disclosure may further include a power switch configured to turn on or off the external power feed system. The power supply device may include an inverter configured to drive an accessory of the vehicle, and a relay. The power supply device may be configured to be electrically divided into a plurality of areas through the inverter and the relay. The controller may be configured to, when the power switch is turned off after determination is made that an electric leak occurs in the power supply device, specify an area where an electric leak occurs among the areas based on a detection result of the internal electric leak detector when the inverter and the relay are turned off in order. According to the first aspect of the present disclosure, the controller turns off the inverter and the relay in order, whereby a specific area can be separated. When no electric leak is detected when the specific area is separated, determination can be made that an electric leak occurs in the separated specific area.

A second aspect of the present disclosure relates to a control method for an external power feed system. The external power feed system includes a vehicle and an external power feed device disposed outside the vehicle. The vehicle includes a power supply device configured to supply electric power to the external power feed device. The vehicle includes an external power feed relay. The external power feed relay is disposed between the external power feed device and the power supply device when the external power feed device is connected to the vehicle. The control method includes, in a case where an external electric leak detector connected to the external power feed device detects an electric leak, turning off the external power feed relay.

In the control method according to the second aspect of the present disclosure, the power supply device may include an internal electric leak detector. The control method may further include, in a case where the external power feed relay is turned on, invalidating the internal electric leak detector, and in a case where the external power feed relay is turned off, validating the internal electric leak detector.

The control method according to the second aspect of the present disclosure may further include, in a case where the internal electric leak detector detects an electric leak after the external power feed relay is turned off, determining that an electric leak occurs in the power supply device, and in a case where the internal electric leak detector detects no electric leak after the external power feed relay is turned off, determining that an electric leak occurs in the external power feed device.

In the control method according to the second aspect of the present disclosure, the external power feed system may include a power switch configured to turn on or off the external power feed system. The power supply device may include an inverter configured to drive an accessory of the vehicle, and a relay. The power supply device may be configured to be electrically divided into a plurality of areas through the inverter and the relay. The control method may further include, when the power switch is turned off after determination is made that an electric leak occurs in the power supply device, specifying an area where an electric leak occurs among the areas based on a detection result of the internal electric leak detector when the inverter and the relay are turned off in order.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Figure 1:
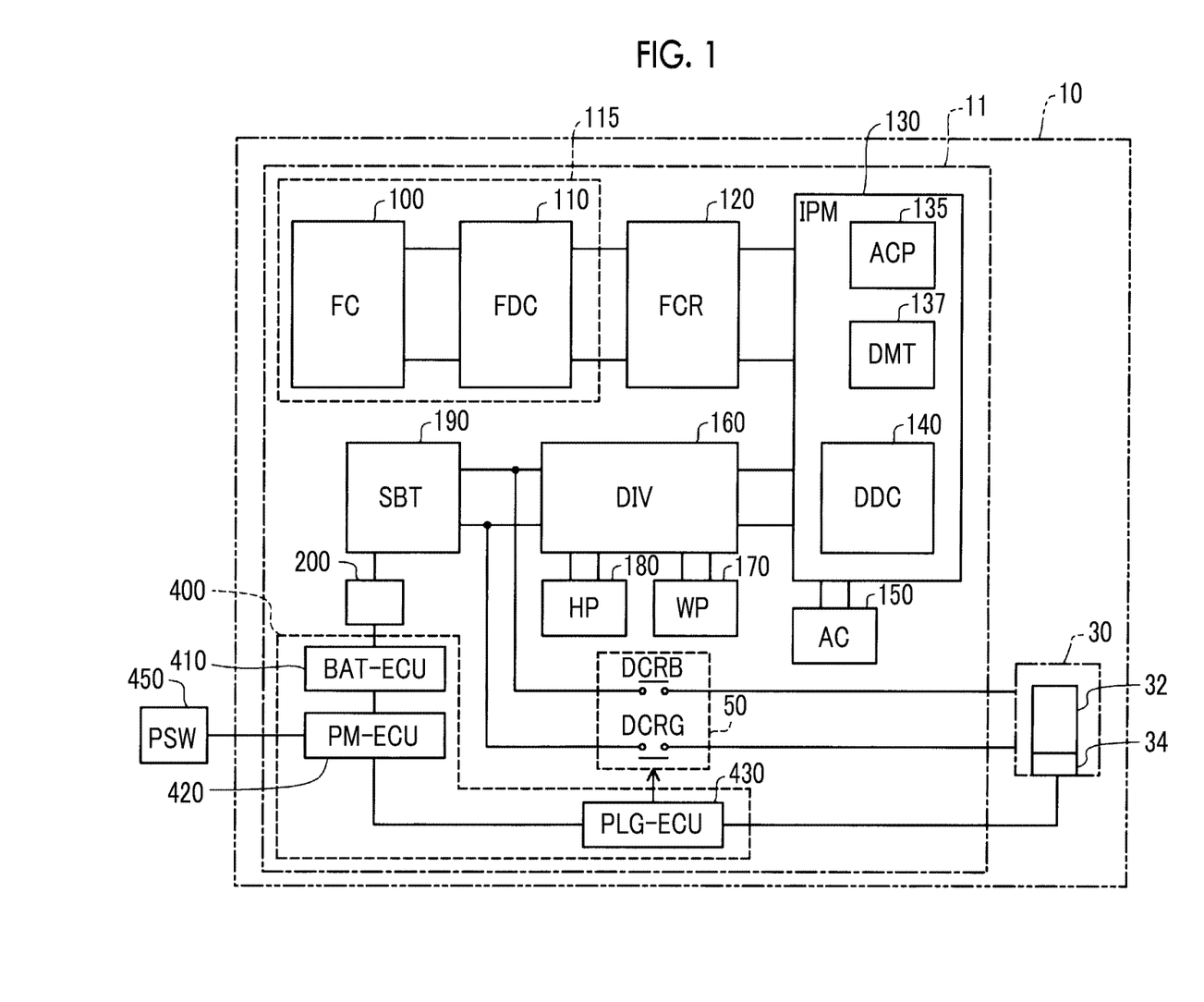
FIG. 1 is an explanatory view showing the schematic configuration of an external power feed system that is mounted in a vehicle.

FIG. 1 is an explanatory view showing the schematic configuration of an external power feed system 10 that is mounted in a vehicle. The external power feed system 10 includes a power supply device 11 and an external power feed unit 30, and supplies direct-current electric power to the external power feed unit 30. The external power feed unit 30 includes an external power feed device 32 and an external electric leak detector 34. The power supply device 11 includes a fuel cell unit 100, an FC converter unit 110 (hereinafter, referred to as an "FC converter 110"), an FC relay unit 120 (hereinafter, referred to as an "FC relay 120"), an intelligent power module unit 130 (hereinafter, referred to as an "IPM 130"), an air conditioner unit 150, a branch unit 160, a water pump unit 170, a hydrogen pump unit 180, a secondary battery unit 190, an external power feed relay 50, an internal electric leak detector 200, and a controller 400.

The IPM 130 includes an air compressor unit 135, a drive motor unit 137, and a DC-DC converter unit 140 (hereinafter, referred to as a "DDC converter 140"). The controller 400 includes a BAT-ECU 410, a PM-ECU 420, and a PLG-ECU 430. The external power feed relay 50 includes a plus-side contact (hereinafter, referred to as an "external power feed relay DCRB") and a minus-side contact (hereinafter, referred to as an "external power feed relay DCRG"). Here, end letters "B", "G" of the symbols of the external power feed relays DCRB, DCRG mean a plus side and a minus side, respectively (the same applies to symbols of other relays or wirings).

The FC converter 110 is connected to the fuel cell unit 100, and the FC relay 120 is connected to the FC converter 110. The fuel cell unit 100 and the FC converter 110 are collectively referred to as a "fuel cell area 115". The IPM 130 is connected to the FC relay 120. The air conditioner unit 150 and the branch unit 160 are connected to the IPM 130. The water pump unit 170, the hydrogen pump unit 180, and the secondary battery unit 190 are connected to the branch unit 160. The internal electric leak detector 200 is connected to the secondary battery unit 190.

The external power feed unit 30 is disposed outside the vehicle and is connected to the secondary battery unit 190 through the external power feed relay 50 disposed in the vehicle.

The BAT-ECU 410 is connected to the internal electric leak detector 200 and controls the internal electric leak detector 200. The PLG-ECU 430 is connected to the external electric leak detector 34 of the external power feed unit 30 outside the vehicle, and when an electric leak detection signal is received from the external electric leak detector 34, switches the external power feed relay 50 from on to off. The connection of the PLG-ECU 430 and the external electric leak detector 34 may be wired connection or wireless connection. The PM-ECU 420 is connected to the BAT-ECU 410 and the PLG-ECU 430, and controls the power supply device 11. A power switch 450 that turns on or off the external power feed system 10 is connected to the PM-ECU 420.

Figure 2:
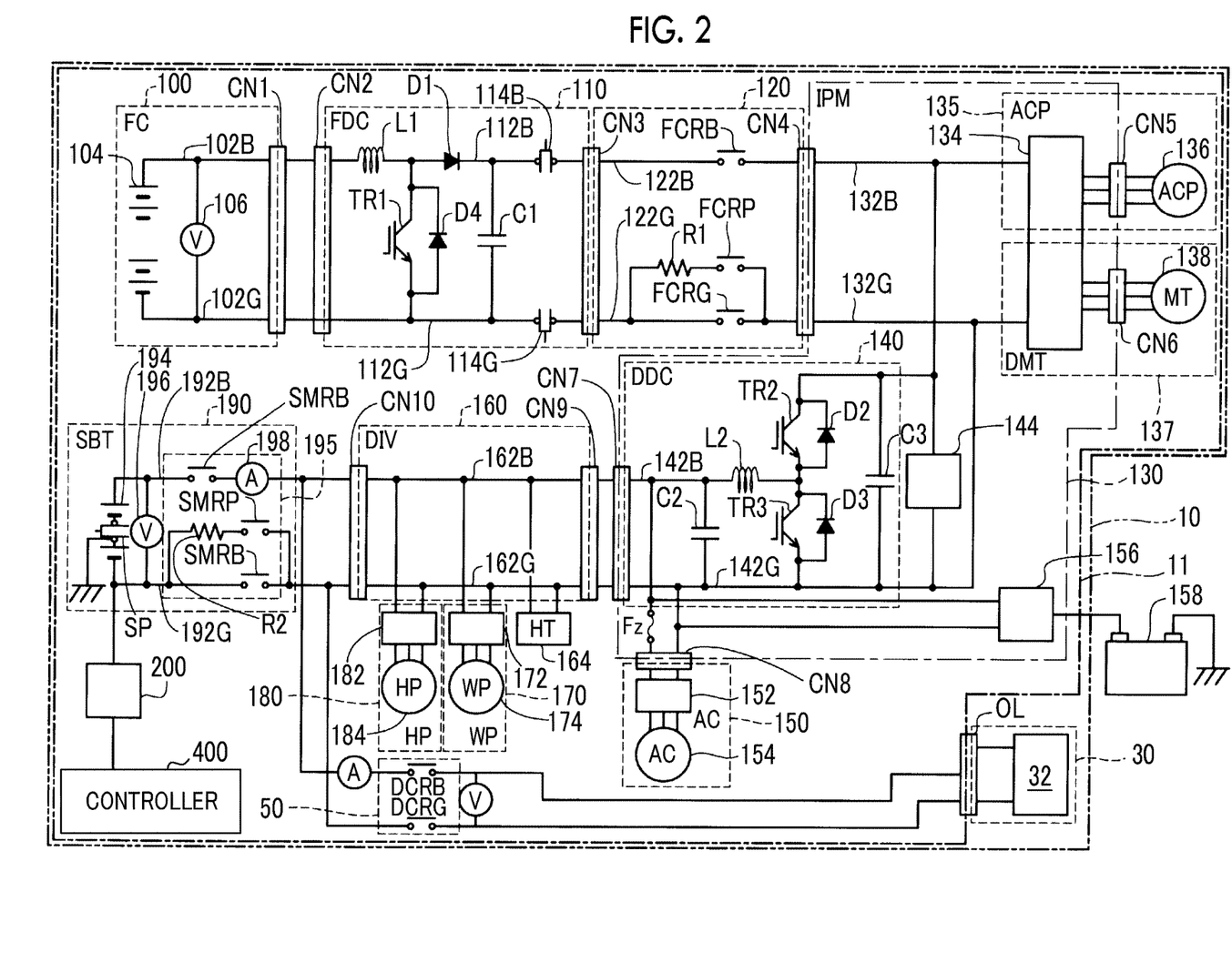
FIG. 2 is an explanatory view showing the external power feed system in more detail.

FIG. 2 is an explanatory view showing the external power feed system 10 in more detail. The fuel cell unit 100 includes high voltage wirings 102B, 102G, a fuel cell stack 104, a voltmeter 106, and a connector CN1. An output of the fuel cell stack 104 is output to the FC converter 110 through the connector CN1.

The FC converter 110 includes high voltage wirings 112B, 112G service plugs 114B, 114C; a reactor L1, a switching transistor TR1, diodes D1, D4, a smoothing capacitor C1, an input-side connector CN2, and an output-side connector CN3. One terminal of the reactor L1 is connected to a plus side of the input-side connector CN2, and the other terminal of the reactor L1 is connected to an anode of the diode D1. A cathode of the diode D1 is connected to the plus-side service plug 114B through the high voltage wiring 112B. A minus side of the input-side connector CN2 is connected to the minus-side service plug 114G through the high voltage wiring 112G The switching transistor TR1 is provided between the anode of the diode D1 and the high voltage wiring 112G The diode D4 is provided in parallel with the switching transistor TR1. The FC converter 110 boosts a voltage input from the input-side connector CN2 and outputs the boosted voltage from the output-side connector CN3 when the switching transistor TR1 is turned on or off.

The FC relay 120 includes high voltage wirings 122B, 122G a plus-side contact (hereinafter, referred to as an "FC relay FCRB"), a minus-side contact (hereinafter, referred to as an "FC relay FCRG"), a precharge contact (hereinafter, referred to as a "precharge relay FCRP"), and a resistor R1. The plus-side FC relay FCRB is provided in the plus-side high voltage wiring 122B, and the minus-side FC relay FCRG is provided in the minus-side high voltage wiring 122G The precharge relay FCRP and the resistor R1 are connected in series, and are provided in parallel with the minus-side FC relay FCRG Since the precharge relay FCRP and the resistor R1 are provided in parallel with the minus-side FC relay FCRG when the precharge relay FCRP is turned on before the minus-side FC relay FCRG is turned on, solely a current limited by the resistor R1 flows in the relay FCRP. As a result, the relay FCRP is not welded when turned on. Thereafter, when the FC relay FCRG is turned on with a decrease in the difference in voltage between both sides with the sandwiched FC relay FCRG a large arc current does not flow when the FC relay FCRG is turned on, and the FC relay FCRG is not welded.

The IPM 130 includes high voltage wirings 132B, 132G, 142B, 142G, an inverter 134, a DDC converter 140, a discharge mechanism 144, and connectors CN4 to CN7. The inverter 134 includes two-system H-type bridge circuits (not shown), and converts direct-current electric power supplied to the high voltage wirings 132B, 132G to two three-phase alternating currents and outputs the two three-phase alternating currents to the connectors CN5, CN6. An air compressor 136 and a drive motor 138 are connected to the connectors CN5, CN6, respectively. The air compressor 136 supplies air to the fuel cell stack 104. The drive motor 138 drives drive wheels (not shown) of the vehicle. The drive motor 138 functions as a regenerative motor during deceleration of the vehicle. One system H-type bridge circuit of the inverter 134, the connector CN5, and the air compressor 136 constitute the air compressor unit 135, and the other system H-type bridge circuit of the inverter 134, the connector CN6, and the drive motor 138 constitute the drive motor unit 137.

The DDC converter 140 is a bidirectional DC-DC converter that deboosts a voltage input from the connector CN4 to the high voltage wirings 132B, 132G and outputs the deboosted voltage to the connector CN7, and boosts the voltage input to the connector CN7 and outputs the boosted voltage to the high voltage wirings 132B, 132G. The DDC converter 140 includes the high voltage wirings 142B, 142G, a reactor L2, switching transistors TR2, TR3, diodes D2, D3, and smoothing capacitors C2, C3. The switching transistors TR2, TR3 are provided in series between the plus-side high voltage wiring 132B and the minus-side high voltage wiring 132G. The diode D2 is provided in parallel with the switching transistor TR2, and the diode D3 is provided in parallel with the switching transistor TR3. The reactor L2 is provided between an intermediate node of the switching transistors TR2, TR3 and the plus-side high voltage wiring 142B. The plus-side high voltage wiring 142B is connected to a plus side of the connector CN7. The smoothing capacitor C2 is provided between the plus-side high voltage wiring 142B and the minus-side high voltage wiring 142G. Note that the minus-side high voltage wiring 132G and the high voltage wiring 142G are connected and have the same potential. The smoothing capacitor C3 is provided between the plus-side high voltage wiring 132B and the minus-side high voltage wiring 132G.

During deceleration of the vehicle, the drive motor 138 (also referred to as a "traction motor 138) functions as a regenerative motor, and regenerates electric power and applies a regenerative brake. A secondary battery 194 is charged with regenerative electric power. However, when the secondary battery 194 is brought into a full charge state, the secondary battery 194 cannot be charged, and thus, the regenerative brake cannot be applied by the drive motor 138. In this case, the discharge mechanism 144 consumes regenerative electric power, whereby it is possible to enable the drive motor 138 to function as a regenerative brake.

The air conditioner unit 150 includes an inverter 152, an air conditioner 154, and a connector CN8. The air conditioner 154 performs air conditioning inside the vehicle. The connector CN8 is connected to the high voltage wirings 142B, 142G of the IPM 130. A fuse Fz is provided between the connector CN8 and the high voltage wiring 142B. A deboost converter 156 is connected to the high voltage wirings 142B, 142G of the IPM 130, and a lead storage battery 158 is provided in the deboost converter 156. The deboost converter 156 deboosts the voltage of the high voltage wirings 142B, 142G to a voltage of the lead storage battery 158, and supplies the deboosted voltage to the lead storage battery 158. The lead storage battery 158 is used as a power supply of the controller 400 and low-voltage accessories of the vehicle, such as a blinker, a headlight, a wiper, and a power window (not shown).

The branch unit 160 includes high voltage wirings 162B, 162G and connectors CN9, CN10, and is a device that distributes electric power supplied to the connector CN9 or the connector CN10. A heater 164, the water pump unit 170, and the hydrogen pump unit 180 are connected to the branch unit 160. The water pump unit 170 includes an inverter 172 and a water pump 174. The water pump 174 circulates a coolant supplied to the fuel cell stack 104. A part of the coolant supplied to the fuel cell stack 104 is branched off from a cooling flow passage and is used for heating the inside of the vehicle. The heater 164 heats the branched coolant. The hydrogen pump unit 180 includes an inverter 182 and a hydrogen pump 184. The hydrogen pump 184 resupplies hydrogen in exhaust gas discharged from the fuel cell stack 104 to the fuel cell stack 104.

The secondary battery unit 190 includes high voltage wirings 192B, 192G the secondary battery 194, a system main relay 195, a voltmeter 196, an ammeter 198, and a service plug SP. The system main relay 195 includes a plus-side contact (hereinafter, referred to as a "system main relay SMRB"), a minus-side contact (hereinafter, referred to as a "system main relay SMRG"), a precharge contact (hereinafter, referred to as a "precharge relay SMRP"), and a resistor R2. The plus-side system main relay SMRB is provided in the plus-side high voltage wiring 192B, and the minus-side system main relay SMRG is provided in the minus-side high voltage wiring 192G. The precharge relay SMRP and the resistor R2 are connected in series, and are provided in parallel with the minus-side system main relay SMRG The service plug SP is provided in the secondary battery 194.

An outlet OL is connected to the high voltage wirings 192B, 192G through the external power feed relay 50. In a case where electric power is supplied to the external power feed device 32, the external power feed device 32 is connected to the outlet OL.

In the embodiment, the high voltage wirings 142B, 162B, 192B between the DDC converter 140 and the secondary battery 194 have the same potential, and the high voltage wirings 142G, 162G, 192G have the same potential.

The internal electric leak detector 200 is connected to a minus side of the secondary battery 194, and the controller 400 is connected to the internal electric leak detector 200.

Figure 3:
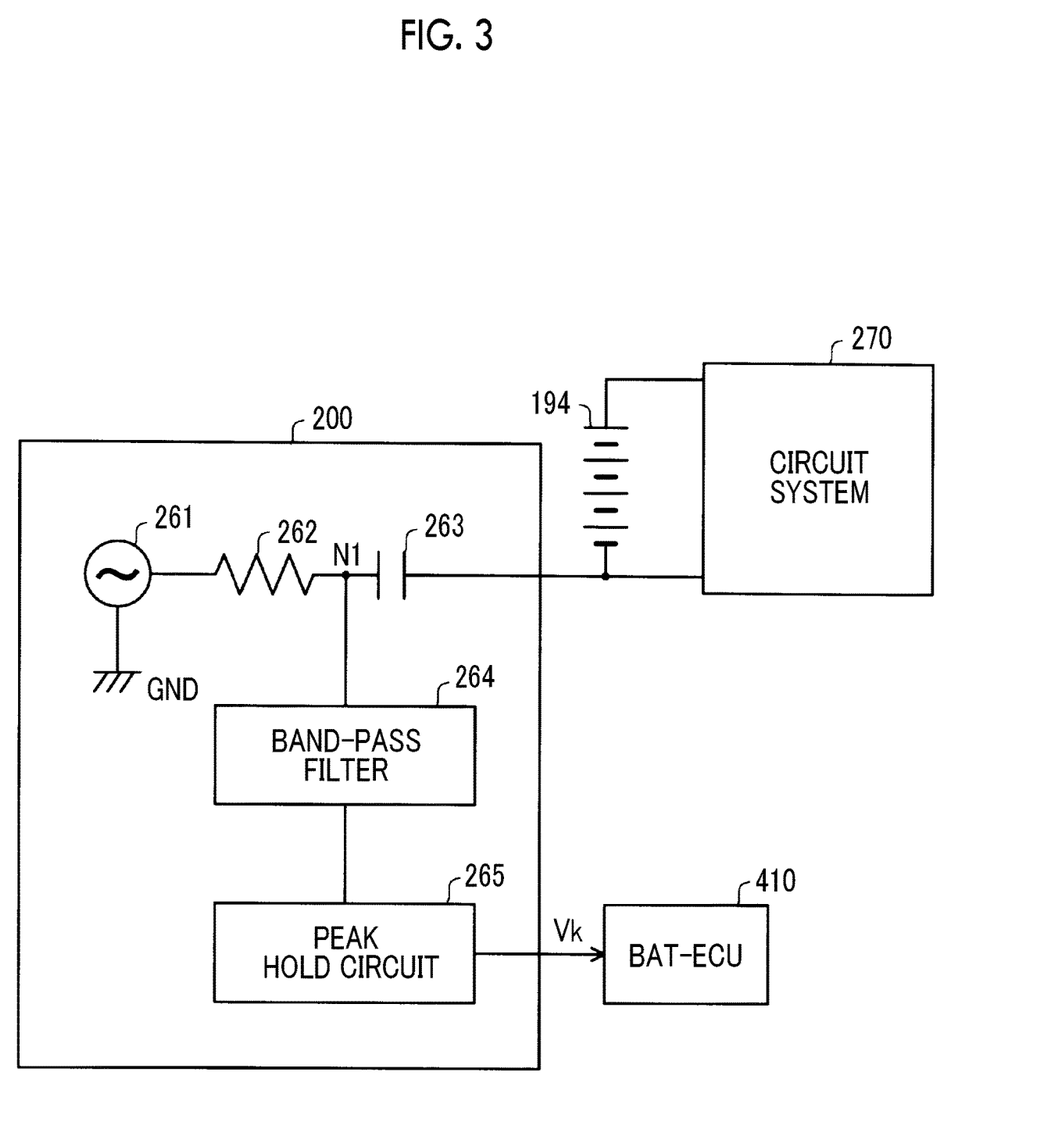
FIG. 3 is a configuration diagram of an internal electric leak detector.

FIG. 3 is a configuration diagram of the internal electric leak detector 200. The internal electric leak detector 200 includes an alternating-current power supply 261, a resistor 262, a capacitor 263, a band-pass filter 264, and a peak hold circuit 265.

The alternating-current power supply 261 and the resistor 262 are connected in series between a node N1 and a ground node GND (a chassis or a body of the vehicle). The capacitor 263 is connected between the node N1 and a negative electrode of the secondary battery 194. Note that, in FIG. 3, the whole of a circuit connected to the secondary battery 194 is shown as a circuit system 270.

The alternating-current power supply 261 outputs an alternating-current signal having a low frequency. The alternating-current signal is a signal for electric leak detection. In the embodiment, the frequency of the alternating-current signal is 2.5 Hz. In the embodiment, a voltage of the alternating-current signal is 5 V. The alternating-current signal is input to the circuit system 270 through the capacitor 263. Accordingly, the circuit system 270 constituting a direct-current power supply circuit is separated from the internal electric leak detector 200 in terms of a direct current. For this reason, the circuit system 270 is insulated from the ground.

The band-pass filter 264 receives an input of the alternating-current signal on the node N1. The band-pass filter 264 extracts a component of 2.5 Hz from the input alternating-current signal and inputs the extracted component to the peak hold circuit 265. The peak hold circuit 265 holds a peak of the alternating-current signal of 2.5 Hz input from the band-pass filter 264 and inputs the held value to the BAT-ECU 410 as a peak value Vk.

The peak value Vk changes according to the presence or absence of an electric leak. That is, the smaller a value of insulation resistance as an electric leak, the smaller the peak value Vk. That is, monitoring the peak value Vk enables detection of a decrease in insulation resistance. The peak value Vk equal to or greater than a determination threshold is referred to as the peak value Vk to be a normal value. When the peak value Vk is the normal value, insulation resistance is normal, and determination is made that no electric leak occurs. When the peak value Vk is less than the determination threshold, this is also expressed that insulation resistance decreases. When insulation resistance decreases less than an initial value (determination value) set as a value in a case where there is no electric leak, by a certain value or more, determination is made that an electric leak occurs.

The external electric leak detector 34 is also provided in the external power feed device 32. Similarly to the internal electric leak detector 200 described referring to FIG. 3, the external electric leak detector 34 has a configuration of detecting an electric leak with a peak value. Note that the external electric leak detector 34 may be an electric leak detector of a type different from the internal electric leak detector 200, for example, a type of detecting a difference in current flowing in two power supply lines subjected to power feed. The internal electric leak detector 200 may also be an electric leak detector of a type of detecting a difference in current flowing in two power supply lines.

Figure 4:
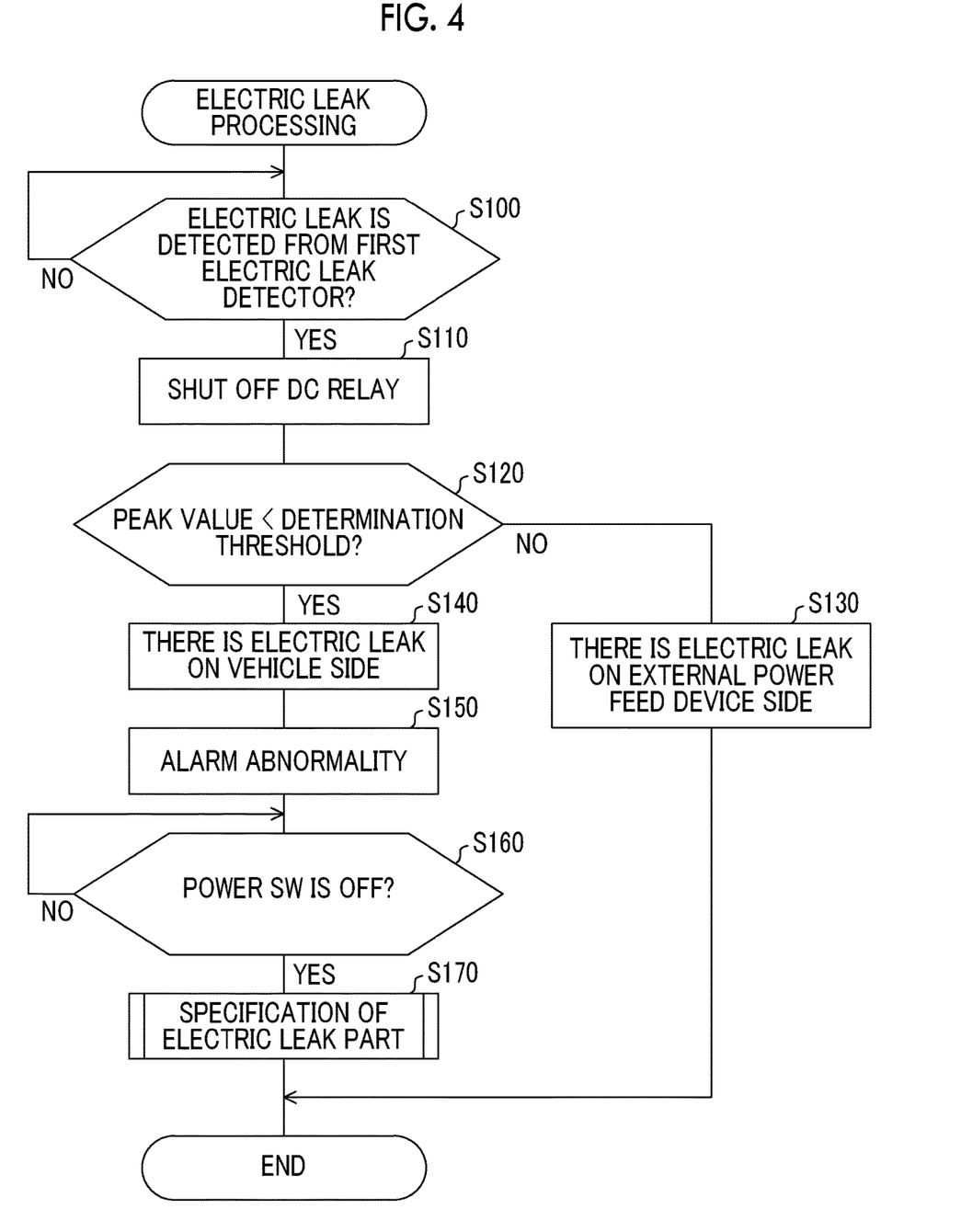
FIG. 4 is a flowchart of processing that a controller executes after power feed to an external power feed device is started.

FIG. 4 is a flowchart of processing that the controller 400 executes after power feed to the external power feed device 32 is started. As described above, the controller 400 includes the three ECUs (BAT-ECU 410, PM-ECU 420, and PLG-ECU 430), and the three ECUs realize the flowchart shown in FIG. 4 in cooperation. For this reason, the flowchart of FIG. 4 will be described as processing of the controller 400.

The ECUs exchange needed data or commands, and can be handled as the controller 400 from outside. Note that the three ECUs can also be integrated into one ECU.

When the external electric leak detector 34 connected to the external power feed device 32 detects an electric leak, in Step S100, the controller 400 receives an electric leak detection signal from the external electric leak detector 34, and detects that an electric leak occurs. In Step S110, the controller 400 turns off the external power feed relay 50 to be shut off, and stops electric power supply to the external power feed device 32.

In Step S120, the controller 400 determines whether or not the peak value Vk is smaller than a prescribed determination threshold. In a case where the peak value Vk is equal to or greater than the prescribed determination threshold, that is, in a case where no electric leak is detected when the external power feed relay 50 is turned off (shut off), the process progresses to Step S130, and determination is made that an electric leak occurs on the external power feed device 32 side. In a case where the peak value Vk is smaller than the prescribed determination threshold, the process progresses to Step S140, and determination is made that an electric leak occurs in the power supply device 11 on the vehicle side.

In Step S150, the controller 400 gives an alarm to a user of the external power feed device 32 that an electric leak occurs on the vehicle side. For example, an alarm may be given through a display on a meter panel or by voice.

In Step S160, when the power switch 450 of the vehicle is turned off, the controller 400 progresses the process to Step S170, and specifies an electric leak part. After the power switch 450 is turned off, in order to specify an electric leak part, accessories and the like of the vehicle can be turned off in order.

Figure 5:
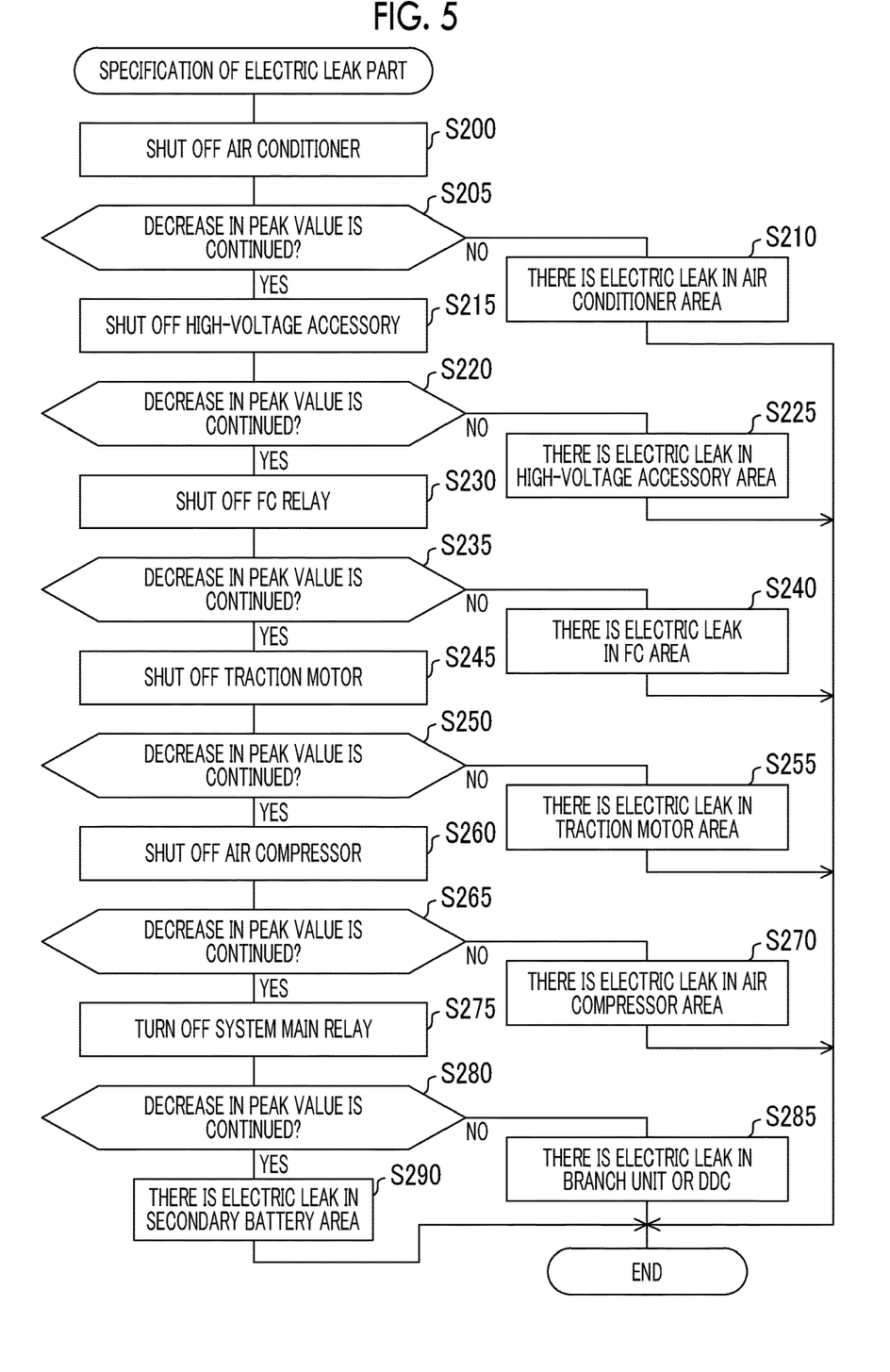
FIG. 5 is a flowchart of specification of an electric leak part that the controller executes in a step of specifying an electric leak part.

FIG. 5 is a flowchart of specification of an electric leak part that the controller 400 executes in Step S170. Similarly to the description of FIG. 4, the flowchart of FIG. 5 will also be described as the processing of the controller 400. In Steps S200 to S210, the controller 400 determines whether or not an electric leak occurs in the air conditioner unit 150. In Step S200, the controller 400 turns off the inverter 152 to shut off the air conditioner 154, and progresses the process to Step S205. In Step S205, the controller 400 determines whether or not a decrease in the peak value Vk is continued even though the air conditioner 154 is shut off. In a case where a decrease in the peak value Vk is not continued, that is, in a case where no electric leak is detected, the process progresses to Step S210, and the controller 400 determines that an electric leak occurs in an area including the air conditioner 154, that is, the air conditioner unit 150. In a case where a decrease in the peak value Vk is still continued and an electric leak is detected, the controller 400 progresses the process to Step S215.

In Steps S215 to S225, the controller 400 determines whether or not an electric leak occurs in an area including a high-voltage accessory. In Steps S215 to S225, the high-voltage accessory means an accessory that operates with electric power supplied from the second high voltage wiring. The high-voltage accessory includes, for example, the water pump 174 and the hydrogen pump 184. The controller 400 determines whether or not an electric leak occurs in an area including the water pump 174, that is, the water pump unit 170. In Step S215, the controller 400 turns off the inverter 172 to shut off the water pump 174, and progresses the process to Step S220. In Step S220, determination is made whether or not a decrease in the peak value Vk is continued even though the water pump 174 is shut off. In a case where a decrease in the peak value Vk is not continued, that is, in a case where no electric leak is detected, the process progresses to Step S225, and the controller 400 determines that an electric leak occurs in an area including the water pump 174, that is, the water pump unit 170. Similarly, the controller 400 determines whether or not an electric leak occurs in an area including the hydrogen pump 184, that is, the hydrogen pump unit 180. In a case where a decrease in the peak value Vk is still continued and an electric leak is detected, the controller 400 progresses the process to Step S230.

In Steps S230 to S240, the controller 400 determines whether or not an electric leak occurs in the fuel cell area 115 including the fuel cell stack 104 and the FC converter 110. In Step S230, the controller 400 turns off the FC relay 120 to shut off the fuel cell unit 100 and the FC converter 110, that is, the fuel cell area 115, and progresses the process to Step S235. In Step S235, determination is made whether or not a decrease in the peak value Vk is continued even though the fuel cell area 115 is shut off. In a case where a decrease in the peak value Vk is not continued, that is, in a case where no electric leak is detected, the process progresses to Step S240, and the controller 400 determines that an electric leak occurs in the fuel cell area 115. In a case where a decrease in the peak value Vk is still continued and an electric leak is detected, the controller 400 progresses the process to Step S245.

Similarly, in Steps S245 to S255, determination is made whether or not an electric leak occurs in an area including the drive motor 138 (traction motor 138), that is, the drive motor unit 137, and in Steps S260 to S270, the controller 400 determines whether or not an electric leak occurs in an area including the air compressor 136, that is, the air compressor unit 135.

In Steps S275 to S290, the controller 400 determines whether an electric leak occurs in an area including the secondary battery 194 or an area including the branch unit 160 and the DDC converter 140. In Step S275, the controller 400 turns off the system main relay 195 to shut off the area including the branch unit 160 and the DDC converter 140, and progresses the process to Step S280. In Step S280, the controller 400 determines whether or not a decrease in the peak value Vk is continued even though the system main relay 195 is turned off. In a case where a decrease in the peak value Vk is not continued, that is, in a case where no electric leak is detected, the process progresses to Step S285, and determination is made that an electric leak occurs in the area including the branch unit 160 and the DDC converter 140. In a case where a decrease in the peak value Vk is continued, the process progresses to Step S290, and determination is made that an electric leak occurs in the area including the secondary battery 194, that is, the secondary battery unit 190.

Figure 6:
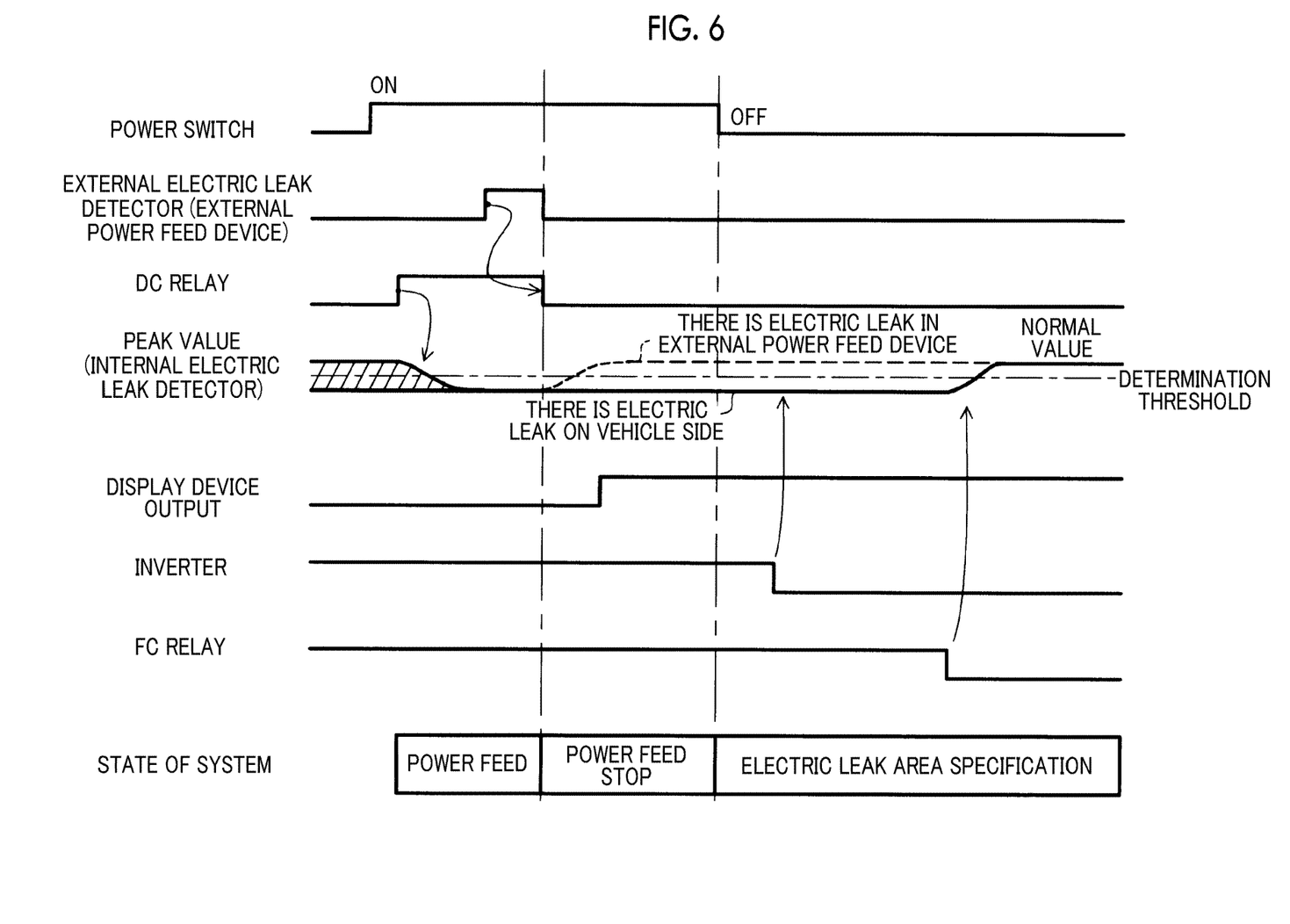
FIG. 6 is a time chart of electric leak detection.

FIG. 6 is a time chart in electric leak detection. In an example shown in FIG. 6, a time chart in a case where there is an electric leak in the fuel cell area 115 is shown. After the power switch 450 is turned on, electric power is supplied to the external power feed device 32. When electric power is supplied to the external power feed device 32, overall insulation resistance decreases. For this reason, even though there is no electric leak, the peak value Vk decreases. In this case, a certain amount of decrease in the peak value Vk depends on the external power feed device 32. Accordingly, it is not possible to determine whether or not an electric leak occurs solely by comparing the peak value Vk of the internal electric leak detector 200 provided inside the vehicle with the determination threshold. For this reason, in the embodiment, a configuration is made that an electric leak is detected with the external electric leak detector 34 connected to the external power feed device 32. When the external electric leak detector 34 connected to the external power feed device 32 detects an electric leak, the controller 400 turns off the external power feed relay 50. As a result, it is possible to shut off electric power supply to the external power feed device 32. That is, when an electric leak occurs, it is possible to stop external power feed. Note that, when external power feed is stopped, the electric leak detection signal from the external electric leak detector 34 is inactivated.

When the external power feed relay 50 is turned off, there is no influence of the external power feed device 32. For this reason, the controller 400 can determine whether or not an electric leak occurs in the power supply device 11 inside the vehicle with the peak value Vk of the internal electric leak detector 200 provided inside the vehicle. In FIG. 6, a case where there is an electric leak in the fuel cell area 115 of the power supply device 11 inside the vehicle is illustrated. When external power feed is started, the peak value Vk of the internal electric leak detector 200 falls. The peak value Vk falls because the insulation resistance value falls with a current flowing in the external power feed device 32. In a case where there is an electric leak in the power supply device 11 inside the vehicle, even though the external power feed relay 50 is turned off, the peak value Vk of the internal electric leak detector 200 is not substantially changed from the fallen state.

In a case where there is an electric leak in the external power feed device 32, the peak value Vk of the internal electric leak detector 200 transits from the fallen state to the normal value, that is, the normal value higher than the determination threshold as indicated by a broken line. That is, the controller 400 can determine whether an electric leak occurs in the external power feed device 32 or an electric leak occurs in the power supply device 11 from the transition of the peak value Vk after the external power feed relay 50 is turned off. In a case where an electric leak occurs in the power supply device 11 inside the vehicle, the controller 400 displays the occurrence of an electric leak on a display device, such as a meter panel, or gives an alarm that an electric leak occurs by voice.

In a case where an electric leak occurs in the power supply device 11 inside the vehicle, when the power switch 450 is turned off, the controller 400 specifies an electric leak area. In the embodiment, the inverter and the relay are turned off in order, and in a case where the peak value Vk transits to the normal value, that is, a value higher than the determination threshold when the inverter or the relay is turned off, the controller 400 determines that there is an electric leak in an area shut off when the inverter or the relay is turned off. For example, in the example shown in FIG. 6, the peak value Vk transits to the normal value when the FC relay 120 is turned off. For this reason, the controller 400 can determine that there is an electric leak in the fuel cell area 115 shut off by the FC relay 120.

According to the embodiment, it is possible to easily detect an electric leak with the external electric leak detector 34 connected to the external power feed device 32, to turn off the external power feed relay 50, and to stop external power feed.

According to the embodiment, the power supply device 11 includes the internal electric leak detector 200 that detects an electric leak, and the controller 400 invalidates the internal electric leak detector 200 in a case where the external power feed relay 50 is turned on and validates the internal electric leak detector 200 in a case where the external power feed relay 50 is turned off. Accordingly, in a case where the external power feed relay 50 is turned on, it is possible to suppress erroneous detection of the internal electric leak detector 200.

In the embodiment, the internal electric leak detector 200 acquires the peak value Vk even in a case where the external power feed relay 50 is turned on, and the controller 400 invalidates the peak value Vk in a case where the external power feed relay 50 is turned on and does not use the peak values Vk for determining the presence or absence of an electric leak. Alternatively, the controller 400 may make an alternating-current signal for electric leak detection be not transmitted from the internal electric leak detector 200 in a case where the external power feed relay 50 is turned on. As described above, in a case where the external power feed relay 50 is turned on, when the operation of the internal electric leak detector 200 is invalidated, it is possible to suppress erroneous detection of an electric leak of the internal electric leak detector 200 due to the influence of the external power feed device 32. Here, as described above, "the operation of the internal electric leak detector 200 is invalidated" may be any of a case where determination is not made to be an electric leak even though the detected peak value Vk of the internal electric leak detector 200 is less than the determination threshold or a case where the operation of the internal electric leak detector 200 is stopped to make the alternating-current signal be not transmitted from the internal electric leak detector 200.

According to the embodiment, it is possible to determine whether there is an electric leak in the external power feed device 32 or there is an electric leak in the power supply device 11 inside the vehicle with the detection result of the internal electric leak detector 200 connected to the secondary battery 194, that is, change in the peak value Vk after the external power feed relay 50 is turned off.

According to the embodiment, the inverters 134, 152, 172, 182 that drive accessories and a plurality of relays (FC relay 120 and system main relay 195) are turned off in order, and when transfer of an alternating-current signal to each area among a plurality of areas divided by the inverters 134, 152, 172, 182 and the relays is shut off in order, it is possible to specify an area where an electric leak occurs among the areas of the power supply device 11 according to whether or not the peak value Vk transits to be higher than the prescribed determination threshold. That is, when transfer of the alternating-current signal to each area is shut off in order, and when the peak value Vk transits to be higher than the prescribed determination threshold, the controller 400 can determine that an electric leak occurs in the shut-off area.

In Step S160 of FIG. 4, although the controller is on standby until the power switch 450 is turned off, in a case where the controller 400 detects that there is an electric leak on the vehicle side in Step S140, when a prescribed time has elapsed after an electric leak is detected, the controller 400 may turn off the power switch 450 and may progress the process to Step S170 to specify an electric leak part.

In the embodiment, although the external power feed system 10 includes the fuel cell stack 104 and the secondary battery 194 as an electric power source, the external power feed system 10 may be an external power feed system including either of the fuel cell stack 104 or the secondary battery 194. The external power feed system 10 may be an external power feed system that drives a power generator with an internal combustion engine instead of the fuel cell stack 104 to generate electric power (alternating-current electric power), converts alternating-current electric power to a direct current with a converter, and performs power feed to the outside.

In the embodiment, although the external power feed system 10 that supplies direct-current electric power to the external power feed unit 30 has been described as an example, the present disclosure can also be applied to an external power feed system that supplies alternating-current electric power to the external power feed unit 30.

An applicable embodiment of the present disclosure is not limited to the above-described embodiment or other embodiments, but may be implemented by various configurations without departing from the gist of the present disclosure. For example, the technical features of the embodiment and other embodiments corresponding to the technical features of the aspects described in "SUMMARY" may be replaced or combined appropriately. Any of the technical features may be omitted appropriately unless the technical feature is described as indispensable herein.

What is claimed is:

1. An external power feed system that supplies electric power from a vehicle to an external load, comprising:
   the vehicle comprising a power supply device that generates electric power; and
   an external power feed device disposed outside the vehicle, the external power feed device including an external electric leak detector configured to detect an electric leak of the external power feed device, wherein:
   the power supply device is configured to supply the generated electric power to the external power feed device when the external load is connected to the external power feed device;
   the vehicle includes an external power feed relay;
   the external power feed relay is disposed between the external power feed device and the power supply device when the external power feed device is connected to the vehicle;
   the vehicle includes a controller configured to control the external power feed relay such that the external power feed relay is turned off when the external electric leak detector detects the electric leak
   the power supply device includes an internal electric leak detector configured to detect an electric leak; and
   the controller is configured to control the internal electric leak detector such that, in a case where the external power feed relay is controlled such that the external power feed relay is turned on, detection of the electric leak of the internal electric leak detector is invalidated, and in a case where the external power feed relay is turned off, detection of the electric leak of the internal electric leak detector is validated.

2. The external power feed system according to claim 1, wherein:
   the controller is configured to, in a case where the internal electric leak detector detects the electric leak after the external power feed relay is controlled to be turned off, determine that an electric leak occurs in the power supply device; and
   the controller is configured to, in a case where the internal electric leak detector detects no electric leak after the external power feed relay is controlled to be turned off, determine that the electric leak occurs in the external power feed device.

3. The external power feed system according to claim 2, further comprising a power switch configured to turn on or off the external power feed system, wherein:

the power supply device includes an inverter configured to drive an accessory of the vehicle, and a first relay;

the power supply device is configured to be electrically divided into a plurality of areas through the inverter and the first relay; and the controller is configured to, when the power switch is turned off after determination is made that the electric leak occurs in the power supply device, specify an area where an electric leak occurs among the areas based on a detection result of the internal electric leak detector when the inverter and the first relay are turned off in order.

4. A control method for an external power feed system, that supplies electric power from a vehicle to an external load, including the vehicle comprising a power supply device that generates the electric power, and an external power feed device disposed outside the vehicle, the power supply device being configured to supply the generated electric power to the external power feed device when the external load is connected to the external power feed device, the vehicle including an external power feed relay, and the external power feed relay being disposed between the external power feed device and the power supply device when the external power feed device is connected to the vehicle, the control method comprising, supplying the generated electric power from the power supply device to the external power feed device, and in a case where an external electric leak detector connected to the external power feed device detects an electric leak of the external power feed device, turning off the external power feed relay;

wherein the power supply device includes an internal electric leak detector configured to detect an electric leak; and the control method further comprising controlling the internal electric leak detector such that, in a case where the external power feed relay is controlled such that the external power feed relay is turned on, detection of an electric leak of the internal electric leak detector is invalidated, and in a case where the external power feed relay is turned off, detection of an electric leak of the internal electric leak detector is validated.

5. The control method according to claim 4, further comprising:

in a case where the internal electric leak detector detects an electric leak after the external power feed relay is turned off, determining that an electric leak occurs in the power supply device; and in a case where the internal electric leak detector detects no electric leak after the external power feed relay is turned off, determining that the electric leak occurs in the external power feed device.

6. The control method according to claim 5, wherein:

the external power feed system includes a power switch configured to turn on or off the external power feed system;

the power supply device includes an inverter configured to drive an accessory of the vehicle, and a first relay;

the power supply device is configured to be electrically divided into a plurality of areas through the inverter and the first relay; and the control method further comprises when the power switch is turned off after determination is made that the electric leak occurs in the power supply device, specifying an area where the electric leak occurs among the areas based on a detection result of the internal electric leak detector when the inverter and the first relay are turned off in order.

* * * * *